(12) United States Patent
Schiaffino et al.

(10) Patent No.: US 7,736,945 B2
(45) Date of Patent: Jun. 15, 2010

(54) LED ASSEMBLY HAVING MAXIMUM METAL SUPPORT FOR LASER LIFT-OFF OF GROWTH SUBSTRATE

(75) Inventors: Stefano Schiaffino, Pleasanton, CA (US); Daniel A. Steigerwald, Cupertino, CA (US); Mari Holcomb, Half Moon Bay, CA (US); Grigoriy Basin, San Francisco, CA (US); Paul Martin, Pleasanton, CA (US); John Epler, Milpitas, CA (US)

(73) Assignees: Philips Lumileds Lighting Company, LLC, San Jose, CA (US); Koninklijke Philips Electronics N.V., Eindhoven (NL)

( * ) Notice: Subject to any disclaimer, the term of this patent is extended or adjusted under 35 U.S.C. 154(b) by 602 days.

(21) Appl. No.: 11/611,775

(22) Filed: Dec. 15, 2006

(65) Prior Publication Data

US 2007/0096130 A1  May 3, 2007

Related U.S. Application Data (63) Continuation-in-part of application No. 11/226,151, filed on Sep. 13, 2005, now Pat. No. 7,348,212, and a continuation-in-part of application No. 11/149,679, filed on Jun. 9, 2005.

(51) Int. Cl.
*H01L 21/00* (2006.01)
(52) U.S. Cl. .................. 438/106; 438/108; 257/E21.503
(58) Field of Classification Search .................. 438/106, 438/108; 257/E21.503
See application file for complete search history.

(56) References Cited

U.S. PATENT DOCUMENTS 6,573,537 B1   6/2003   Steigerwald et al.

(Continued)

FOREIGN PATENT DOCUMENTS

WO    2005062905 A2    7/2005
WO    2006131843 A2    12/2006

OTHER PUBLICATIONS

International Search Report and Written Opinion, 14 pages.

*Primary Examiner*—Thao X Le
*Assistant Examiner*—Elias Ullah
(74) *Attorney, Agent, or Firm*—Patent Law Group; Brian Ogonowsky (57) ABSTRACT

Described is a process for forming an LED structure using a laser lift-off process to remove the growth substrate (e.g., sapphire) after the LED die is bonded to a submount. The underside of the LED die has formed on it anode and cathode electrodes that are substantially in the same plane, where the electrodes cover at least 85% of the back surface of the LED structure. The submount has a corresponding layout of anode and cathode electrodes substantially in the same plane. The LED die electrodes and submount electrodes are ultrasonically welded together such that virtually the entire surface of the LED die is supported by the electrodes and submount. Other bonding techniques may also be used. No underfill is used. The growth substrate, forming the top of the LED structure, is then removed from the LED layers using a laser lift-off process. The extremely high pressures created during the laser lift-off process do not damage the LED layers due to the large area support of the LED layers by the electrodes and submount.

11 Claims, 11 Drawing Sheets

U.S. PATENT DOCUMENTS

| | | |
|---|---|---|
| 6,576,488 B2 * | 6/2003 | Collins, III et al. ............ 438/29 |
| 6,650,044 B1 * | 11/2003 | Lowery ....................... 313/502 |
| 6,828,596 B2 | 12/2004 | Steigerwald et al. |
| 6,885,035 B2 * | 4/2005 | Bhat et al. .................... 257/99 |
| 7,375,431 B1 * | 5/2008 | Patwardhan et al. ......... 257/773 |
| 2004/0061123 A1 | 4/2004 | Shelton et al. |
| 2008/0113460 A1 * | 5/2008 | Shelton et al. ................ 438/28 |

* cited by examiner

LED ASSEMBLY HAVING MAXIMUM METAL SUPPORT FOR LASER LIFT-OFF OF GROWTH SUBSTRATE

CROSS-REFERENCE TO RELATED APPLICATIONS

This is a continuation-in-part of U.S. application Ser. No. 11/149,679, filed Jun. 9, 2005, entitled Method of Removing the Growth Substrate of a Semiconductor Light Emitting Device, by John Epler et al., assigned to the present assignee and incorporated herein by reference in its entirety.

The present application is also a continuation-in-part of U.S. application Ser. No. 11/226,151, filed Sep. 13, 2005, entitled Interconnects for Semiconductor Light Emitting Devices, by Stefano Schiaffino et al., assigned to the present assignee and incorporated herein by reference in its entirety.

FIELD OF INVENTION

This invention relates to light emitting diodes (LEDs) and, in particular, to techniques for bonding a flip chip LED to a submount for robust support of the fragile LED.

BACKGROUND

Semiconductor light-emitting diodes (LEDs) are among the most efficient light sources currently available. Materials systems currently of interest in the manufacture of high-brightness light emitting devices capable of operation across the visible spectrum include Group III-V semiconductors; for example, binary, ternary, and quaternary alloys of gallium, aluminum, indium, nitrogen, phosphorus, and arsenic. III-V devices emit light across the visible spectrum. GaAs- and GaP-based devices are often used to emit light at longer wavelengths such as yellow through red, while III-nitride devices are often used to emit light at shorter wavelengths such as near-UV through green.

Gallium nitride LEDs typically use a transparent sapphire growth substrate due to the crystal structure of sapphire being similar to the crystal structure of gallium nitride.

Some GaN LEDs are formed as flip chips, with both electrodes on the same surface, where the LED electrodes are bonded to electrodes on a submount without using wire bonds. In such a case, light is transmitted through the transparent sapphire substrate, and the LED layers oppose the submount. A submount provides an interface between the LED and an external power supply. Electrodes on the submount bonded to the LED electrodes may extend beyond the LED or extend to the opposite side of the submount for wire bonding or surface mounting to a circuit board.

Figure 1:
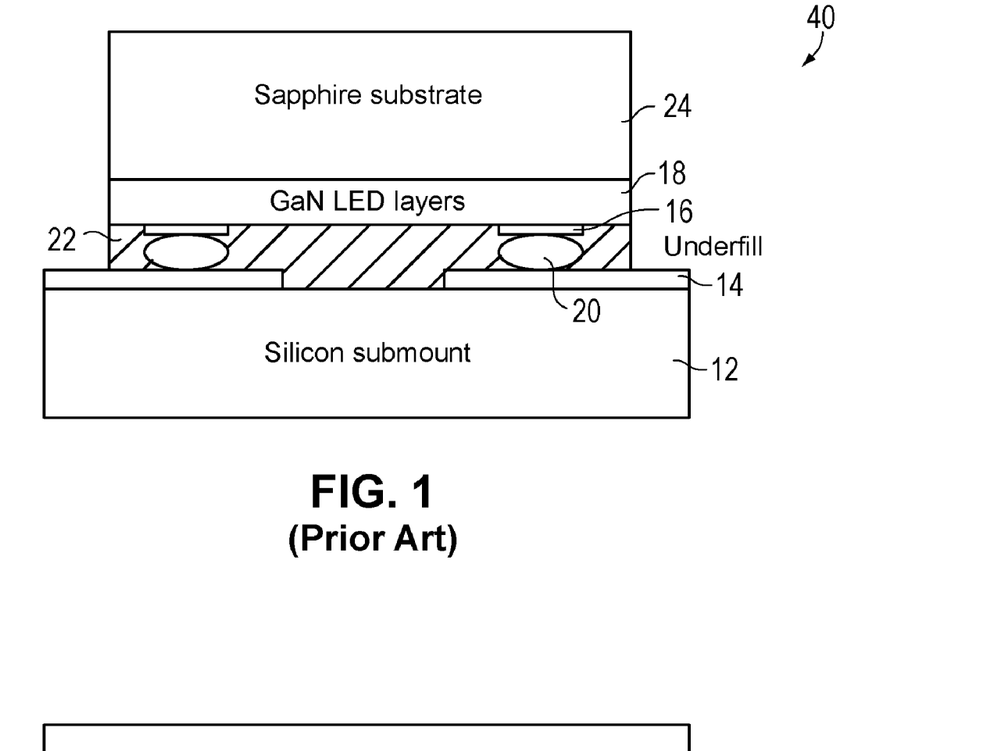
FIG. 1 is a cross-section of a prior art LED die, including a transparent growth substrate, bonded to a submount.

FIG. 1 is a simplified cross-section of a GaN LED 10 mounted to a submount 12. The submount may be formed of silicon or may be a ceramic insulator. If the submount is silicon, an oxide layer may insulate the metal pattern on the submount surface from the silicon, or different schemes of ion implantation can be realized for added functionality such as electro-static discharge protection.

Metal pads 14 on the submount are electrically bonded to metal electrodes 16 on the GaN layers 18, where the electrodes 16 are in electrical contact with the n-type and p-type layers of the LED. The bond typically uses gold stud bumps 20. The gold stud bumps 20 are generally spherical gold balls placed at various points between the LED electrodes and the submount metal pads. This is a time-consuming process since the stud bumps must be individually placed. Pressure is applied to the LED structure while an ultrasonic transducer rapidly vibrates the LED structure with respect to the submount to create heat at the interface. This causes the surface of the gold stud bumps to interdiffuse at the atomic level into the LED electrodes and submount electrodes to create a permanent electrical connection.

Other types of bonding methods include soldering, applying a conductive paste, and other means.

Between the LED layers and the submount surface is a large void that is filled with an epoxy to provide mechanical support and to seal the area. The resulting epoxy is referred to as an underfill 22. Underfilling is very time-consuming since each LED must be underfilled separately, and a precise amount of underfill material needs to be injected and prevented from spreading in an uncontrolled fashion onto undesirable surfaces, such as the top of the LED device or pads on the submount where wire bonds must be subsequently applied.

Applicants are developing LED structures with the sapphire substrates removed after the LED structure is bonded to the submount. Since the LED layers are very thin and brittle, the underfill serves the additional purpose to provide the necessary mechanical support to prevent fracturing of the fragile LED layers. The gold stud bumps 20 do not provide sufficient support by themselves to prevent fracturing of the LED layers since, given their limited shape, they are spaced too far apart. The underfill, however, has to flow through a complicated geometry without trapping any bubbles that could result in poorly supported regions. Additionally, underfill materials are typically composed of organic substances and possess very different thermal expansion properties from metal and semiconductor materials. Such spurious expansion behavior is particularly aggravated at high operating temperatures—typical of high power LED applications—where underfill materials approach their glass transition point and begin to behave as glassy substances. The net effect of such mismatch in thermal expansion behavior is to induce stresses on the LED devices that limit or reduce their operability at high power conditions. Lastly, underfill materials have low thermal conductivity properties that result in unnecessarily high temperature operation for the semiconductor devices.

What are needed are techniques for mechanically supporting the thin LED layers during a substrate removal process which, compared to an underfill, (i) provide a lower cost and higher throughput manufacturable solution, (ii) provide more uniform and void free support, (iii) provide a support with more closely matched thermal expansion behavior, (iv) provide a support with high temperature operability, not limited by the glass transition point of organic materials, and (v) provide a support with improved thermal conductivity for superior heat sinking.

SUMMARY

Described herein is a process for forming an LED structure using a laser lift-off process to remove the growth substrate (e.g., sapphire) after the LED die is bonded to a submount. To obviate the need to use an underfill between the submount and the LED die to support the die, the underside of the LED die has formed on it anode and cathode electrodes that are substantially in the same plane, where the electrodes cover at least 85% of the back surface of the LED structure. The submount has a corresponding layout of anode and cathode electrodes substantially in the same plane.

The LED die electrodes and submount electrodes are interconnected together such that virtually the entire surface of the LED die is supported by the electrodes and submount. No underfill is used. Different methods for LED to submount interconnection can be used, such as ultrasonic or thermosonic metal-to-metal interdiffusion (Gold-Gold, Copper-Copper, other ductile metals, or a combination of the above), or soldering with different alloy compositions such as Gold-Tin, Gold-Germanium, Tin-Silver, Tin-Lead, or other similar alloy systems.

The growth substrate, forming the top of the LED structure, is then removed from the LED layers using a laser lift-off process, which ablates the material at the interface of the growth substrate and the LED layers. The extremely high pressures created during the laser lift-off process do not damage the LED layers due to the large area support of the LED layers by the electrodes and submount. Other substrate removal processes can also be used.

Various layouts are described for contacting the p and n-layers and supporting the LED die around its edges, which are very susceptible to breakage.

DETAILED DESCRIPTION

Various intermediate LED structures are shown in the figures, illustrating key steps in the formation of an LED in accordance with one embodiment of the invention.

Figure 2:
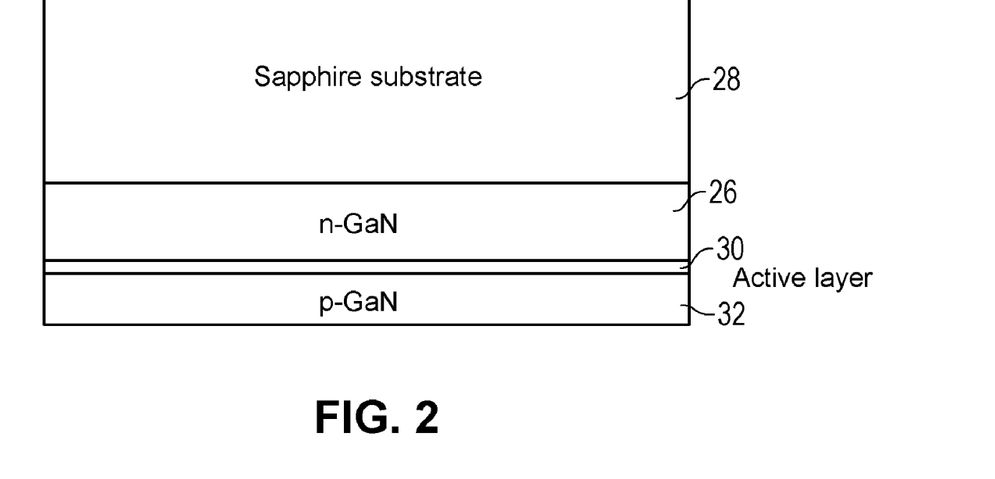
FIG. 2 is a cross-section of a GaN-based LED structure during an intermediate stage in a process performed in accordance with one embodiment of the present invention.

In FIG. 2, an n-type GaN layer 26 is grown over a sapphire substrate 28 using conventional techniques. The GaN layer 26 may be multiple layers including a clad layer. The GaN layer 26 may include Al, In, and an n-type dopant. An active layer 30 is then grown over the GaN layer 26. The active layer 30 will typically be multiple GaN-based layers and its composition (e.g., $In_xAl_yGa_{1-x-y}N$) depends on the desired wavelength of the light emission and other factors. The active layer 30 may be conventional. A p-type GaN layer 32 is then grown over the active layer. The GaN layer 32 may be multiple layers including a clad layer and may also be conventional. The GaN layer 32 may include Al, In, and a p-type dopant. The LED structure of FIG. 2 is referred to as a double heterostructure.

In one embodiment, the substrate is about 90 microns thick, and the GaN layers have a combined thickness of approximately 4 microns.

Although a GaN based LED with a sapphire growth substrate is used in the example, other types of LEDs using other substrates such as SiC (used to form an InAlGaN LED) and GaAs (used to form an AlInGaP LED) may benefit from the invention.

Figure 3:
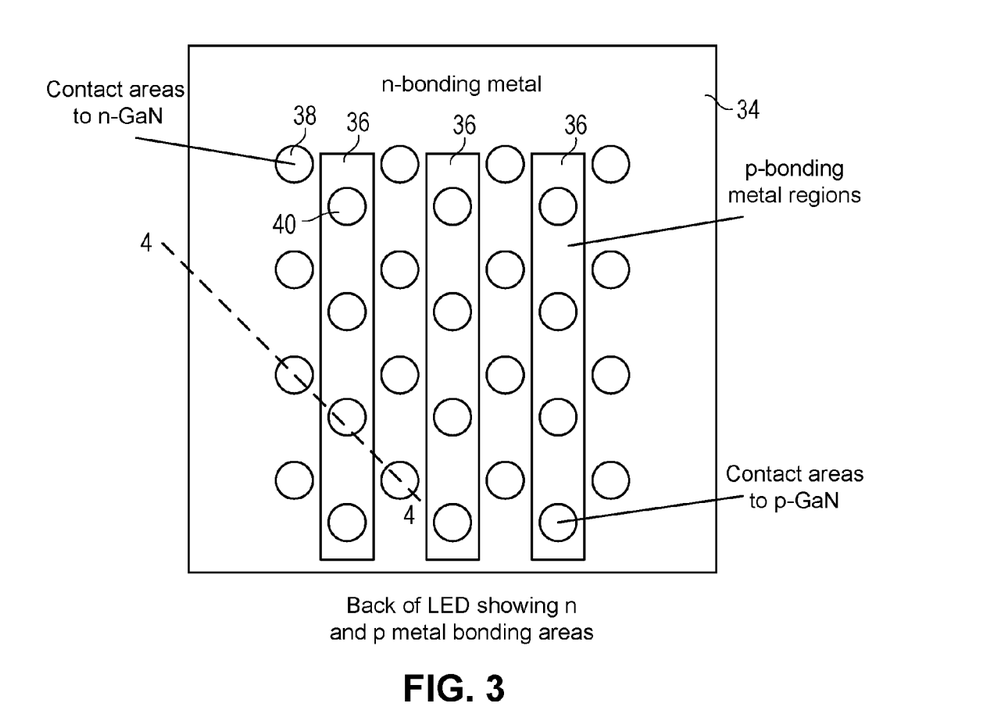
FIG. 3 illustrates the bottom surface of the LED structure of FIG. 2 after a bonding metal pattern has been formed to contact the n and p GaN layers.
Figure 4:
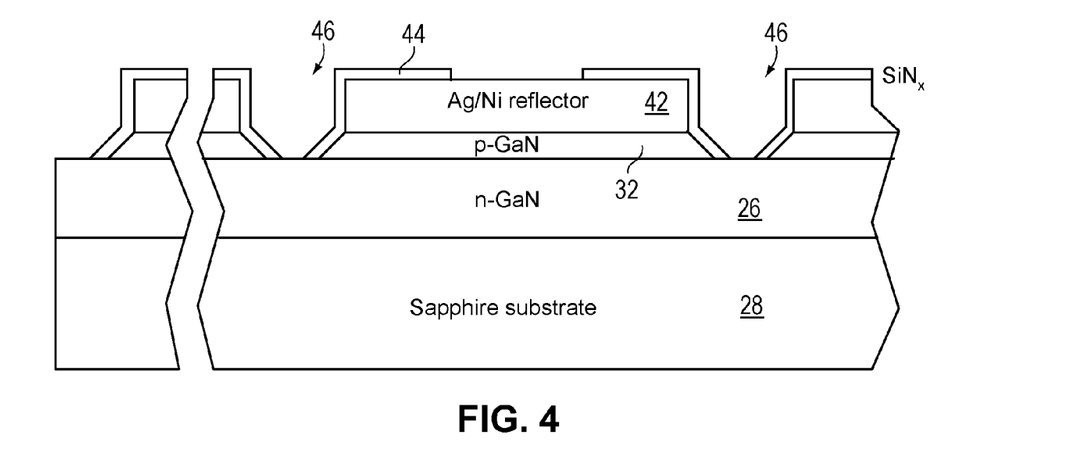
FIG. 4 is a partial cross-section of the LED structure of FIG. 2, along line 4-4 in FIG. 3, during an intermediate stage where openings in the p layer have been etched to expose the underlying n layer, and an insulating layer has been formed over portions of the LED surface.
Figure 5:
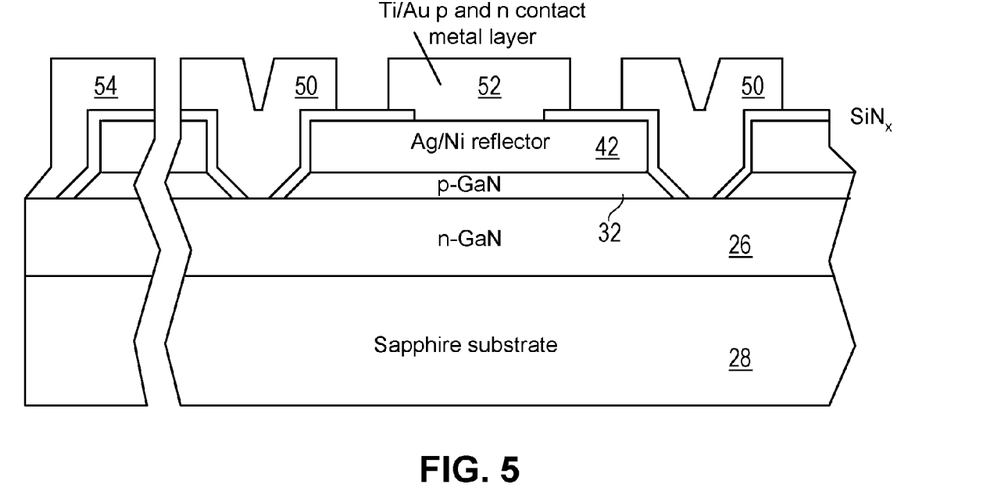
FIG. 5 illustrates the LED structure on FIG. 4 after a metal layer has been formed over the surface of the LED structure to make electrical contact to the n and p GaN layers.
Figure 6:
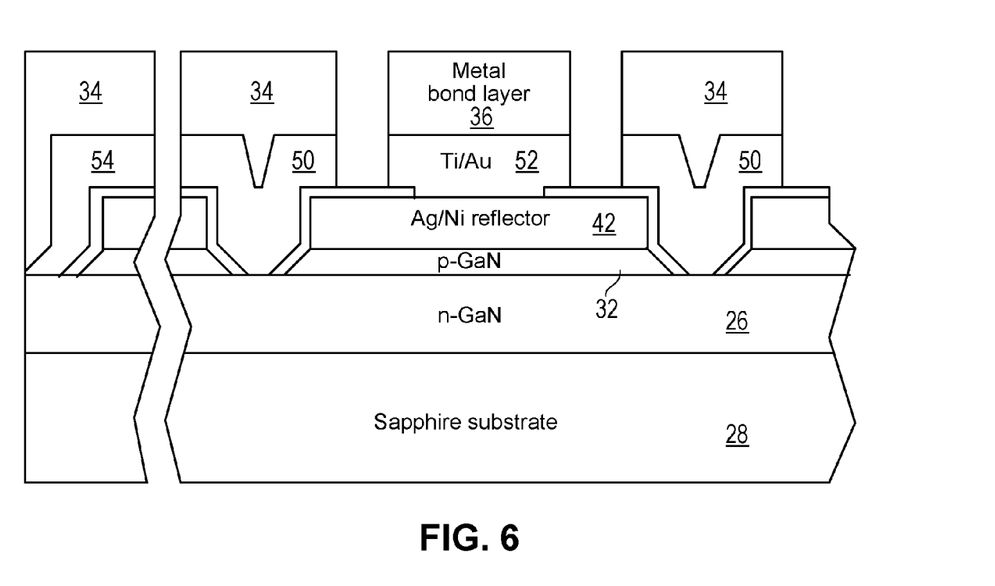
FIG. 6 illustrates the LED structure of FIG. 5 after the metal layer has formed over it (via plating, evaporation, sputtering, or other appropriate deposition techniques) gold, a gold alloy, copper, aluminum, nickel, or other malleable metals, where the deposited metal layer forms the LED bonding metal layer (FIG. 3) for direct bonding to the gold submount bonding metal.

FIG. 3 is a view of the back of the LED, opposite the substrate side, showing the completed metal bond layer after the processes shown in FIGS. 4-6. The n bonding metal 34 and p bonding metal 36 cover virtually the entire back surface of the LED, such as greater than 85%. There is a gap (e.g., 27 microns) between the n and p bonding metal portions for electrical isolation. The gap is preferably less than 50 microns. As will be described in detail later, the n bonding metal 34 is connected to the n-GaN layer 26 (FIG. 2) via openings etched in the p-GaN layer 32 and active layer 30 at sixteen contact areas 38. The p bonding metal 36 is connected to the p-GaN layer 32 (FIG. 2) via openings formed in an insulation layer at a number of contact areas 40. These dotted contact areas 38/40 may take other than a circular shape. The number of contact areas is not critical; however, more contact areas provides better coupling of the power to the n and p GaN layers for a brighter and more uniform emission. In an actual embodiment, the p bonding metal 36 portions are not rectangular but scalloped shaped to extend about half way between adjacent n GaN layer contact areas 38 to increase the p bonding metal area.

In the embodiment shown in FIG. 3, there is a narrow strip of the n bonding metal 34 along the bottom edge of the LED. In another embodiment, there is no narrow n bonding metal strip between the bottom edge of the p bonding metal 36 rectangles and the bottom edge of the LED die. By eliminating the narrow metal strip, it is easier to provide conductors on the submount that contact the p bonding metal 36 and extend out from the edge of the LED die to terminate in a wire bond pad or surface mount pad on the submount.

FIG. 4 is a partial cross-section of the LED taken along line 4-4 in FIG. 3 at an intermediate stage in the process (i.e., between the stages shown in FIGS. 2 and 3). At this intermediate stage, the LED is part of a wafer containing many other LEDs. Details of steps that may be conventional or well known in the art of forming GaN LEDs do not need to be described, and there may be many ways of forming the same structure shown in the figures. Such details that may be conventional or well known include cleaning, deposition techniques (e.g., sputtering, CVD, electro-plating, etc.), lithographic techniques, masking techniques, etching techniques, metal lift-off techniques, photoresist stripping techniques, and separating dies from a wafer.

The active layer of the LED is not shown in the figures for simplicity.

In FIG. 4, a conductive reflective layer 42 is deposited over the p-GaN layer 32. The reflective layer 42 may be a 7 Angstrom layer of Ni followed by a 1000 Angstrom thick layer of Ag. Additional layers of metal over the Ag layer, such as TiW/TiW:N/TiW/AuZn, totaling about 7000 Angstroms, may be deposited as intermediate barrier and bonding layers for a subsequent metal deposition. Such additional layers are well known and not shown for simplicity. Such additional layers may be formed by sputter deposition and lift-off techniques (to avoid etching). The reflective layer 42 in FIG. 4 is assumed to contain all such layers, with the thin Ag/Ni layer being formed directly on the p-GaN layer 32.

The wafer is then masked and etched to form holes 46 through the reflective layer 42, the p-GaN layer 32, and the active layer to expose the n-GaN layer 26. FIG. 3 illustrates the positions of these holes 46, labeled as contact areas 38 in FIG. 3. Various etching techniques are used for the different materials.

An insulation layer 44, such as SiNx, is then deposited over the surface of the wafer and etched to expose the n-GaN layer 26 through the holes 46. The insulating layer 44 is also etched to expose the top surface of the reflective layer 42. The areas where the reflective layer 42 is exposed correspond to the p contact areas 40 in FIG. 3.

A left edge of a die area on the wafer is shown in FIG. 4. The n-GaN layer 26 is exposed around the entire edge of each die for subsequent contact with metal.

In FIG. 5, a metal bonding layer (e.g., TiAu or Al) is formed over the wafer to form n-contacts 50 and p-contacts 52. The contacts may be patterned by forming a masking layer at positions where the metal contacts are not desired, then depositing the metal contact layer over the entire wafer, and then stripping the masking layer to lift off the metal deposited over it. Note that the metal also contacts the n-GaN layer 26 around the edge of the die to form an edge contact 54. Preferably, the edge contact 54 extends as close to the edge of the LED layers as practical for support of the edge portions of the LED layers during the subsequent substrate removal process.

The metal layers could also be negatively patterned by depositing similarly stacked blanket metal layers and then selectively etching them back using a masking scheme.

In FIG. 6, a thick (~20-25 um) metal layer of Au, Cu, Al, Ni or other ductile material, or a combination of such layers, is formed on the n bonding metal 34 and p bonding metal 36. Such thick metal layer may be deposited electro-chemically (e.g. electro-plating) or using other physical deposition methods (e.g. evaporation or sputtering). A combination of the layers above may be advantageous for performance and cost optimization: thick layers of Au tend to be expensive, and Cu provides a lower cost approach with potentially higher thermal, mechanical, and electrical performances. In such cases, a thinner capping of Au may however still be required to prevent oxidation and facilitate the ultrasonic or thermosonic gold-gold-atomic interdiffusion during the die bonding step. Furthermore, the die assembly process may be performed with any solder reflow technique based on any of the standard alloy systems typically employed in the industry, such as different composition of Gold-Tin, Gold-Germanium, Tin-Silver, Tin-Lead, and others, at or near the eutectic composition, or at a stoichiometrically different point if the metallurgy of the reflow requires so. The back surface of each LED in the wafer after such a thick metal deposition step is shown in FIG. 3. Although various metals are shown in the figures, any other suitable metal may be used instead.

The wafer is then diced to separate out the LED chips. Typically, a laser first scribes the wafer along the die edges, and the brittle wafer is then bent around a curved surface to break the wafer along the scribe lines. Prior to breaking, the wafer is adhered to a stretchable plastic sheet, and after the wafer is broken along the scribe lines, the sheet is stretched to separate the die while the die remain adhered to the stretchable sheet. An automatic pick and place device then removes each die from the sheet, mounts the die on a submount, and ultrasonically or thermosonically welds the Au bonding metal on the LED directly to a corresponding Au bonding metal pattern on the submount. No gold stud bumps are used. A solder layer may also be used as explained above. Preferably, there are no gaps between the opposing bonding layers, such as would be created using gold stud bumps.

Figure 7:
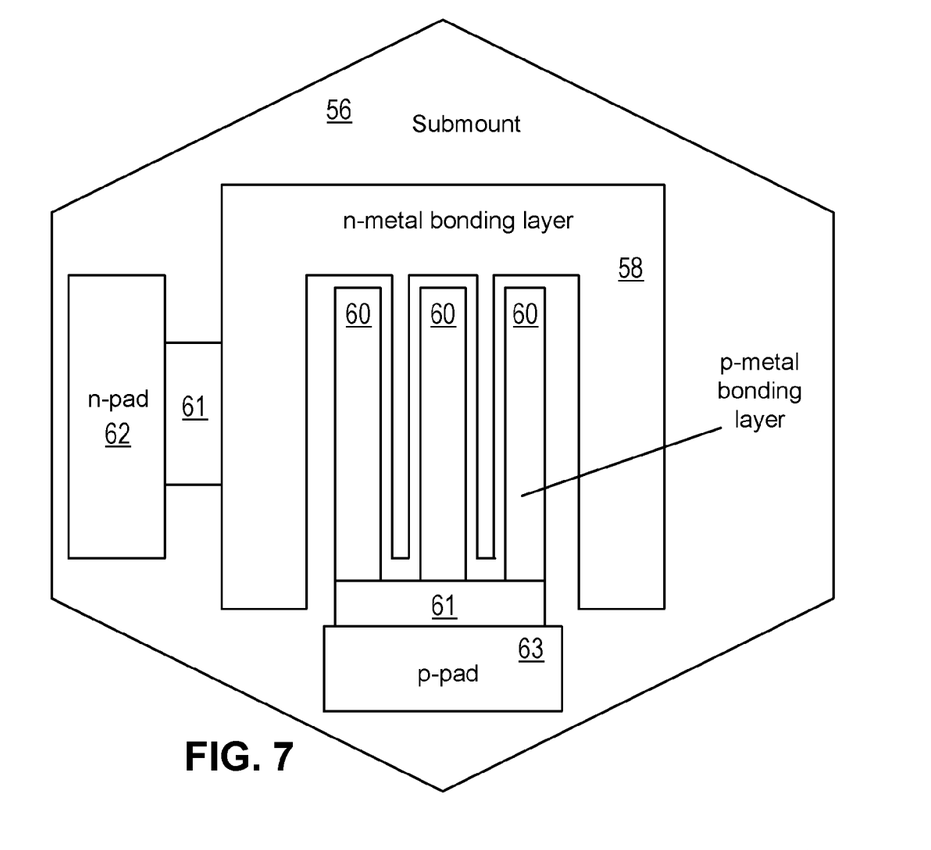
FIG. 7 is a top down view of the submount showing a raised gold pattern corresponding to the bonding metal pattern (FIG. 3) on the back of the LED structure. Wire bond pads or surface mount pads on the submount extend out beyond the LED die for connection to a power supply.
Figure 8:
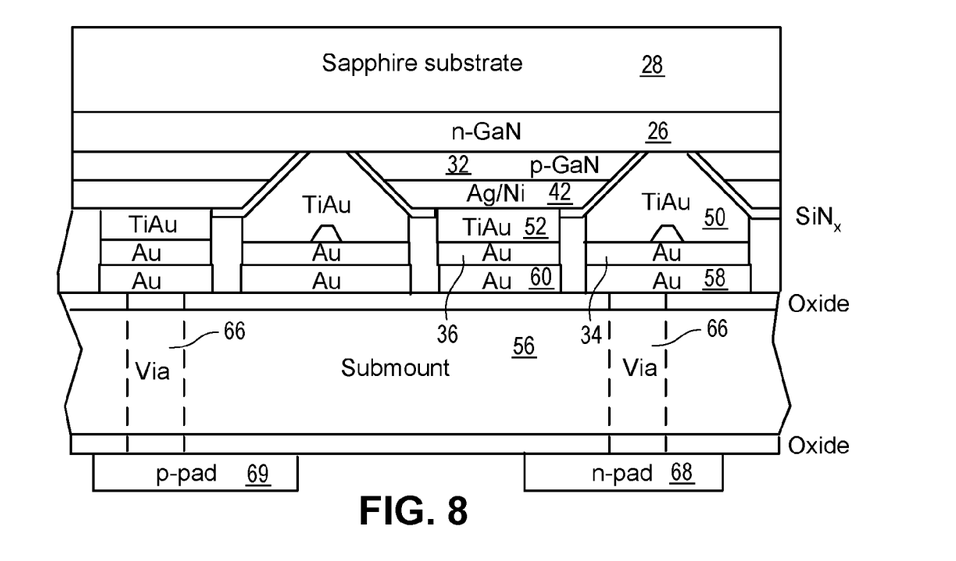
FIG. 8 is a partial cross-section of the LED structure of FIG. 6 mounted on the submount, where the bonding metal on the LED and submount are ultrasonically welded together without the use of gold stud bumps, and where almost the entire back surface of the LED structure is supported by the bonding metal layers and submount without the use of an underfill.

As shown in FIG. 7, an Au bonding metal pattern substantially matching the n and p bonding metal pattern of FIG. 3 is formed on the surface of a submount 56. In FIG. 7, the n-bonding metal 58 matches the n-bonding metal 34 on the LED, and the p-bonding layer 60 matches the p-bonding metal 36 on the LED. Preferably, the interface of the bonding metals is in a single plane. The particular electrode pattern shown comprises interdigitated metal fingers, which provide good current spreading. The Au metal pattern may be formed by conventional techniques such as screen printing or etching a metal pattern over an insulation layer on the submount and then plating the metal pattern with Au. A conductive layer portion 61 extends out from the p and n bonding metal and connects to relatively thick metal pads 62 and 63 for wire bonding to a power supply. The conductive layer portion 61 may have an insulation layer over it. Alternatively, conductive vias 66 (FIG. 8) through the submount 56 allow the power supply connection to be made from the bottom of the submount 56, such as for a surface mount. In FIG. 8, bottom n and p bond pads 68 and 69 are shown.

There may be many vias, and only two are shown in FIG. 8 for simplicity. There may be more than one via for each of the three p bonding metal 60 portions in FIG. 7 that are electrically connected to a single p bonding pad on the bottom surface of the submount. Multi-level metallization patterns, where each metal layer is insulated from another metal layer by an insulating layer, can be designed for the top or bottom surface of the submount so metal conductors can be routed over other metal conductors without shorting. The metal patterns depend on the specific application of the LED structure.

In one embodiment, the gaps between the anode and cathode metal portions on the LED layers and submount are made to be the minimum practical so as to maximize the electrode coverage.

Figure 9:
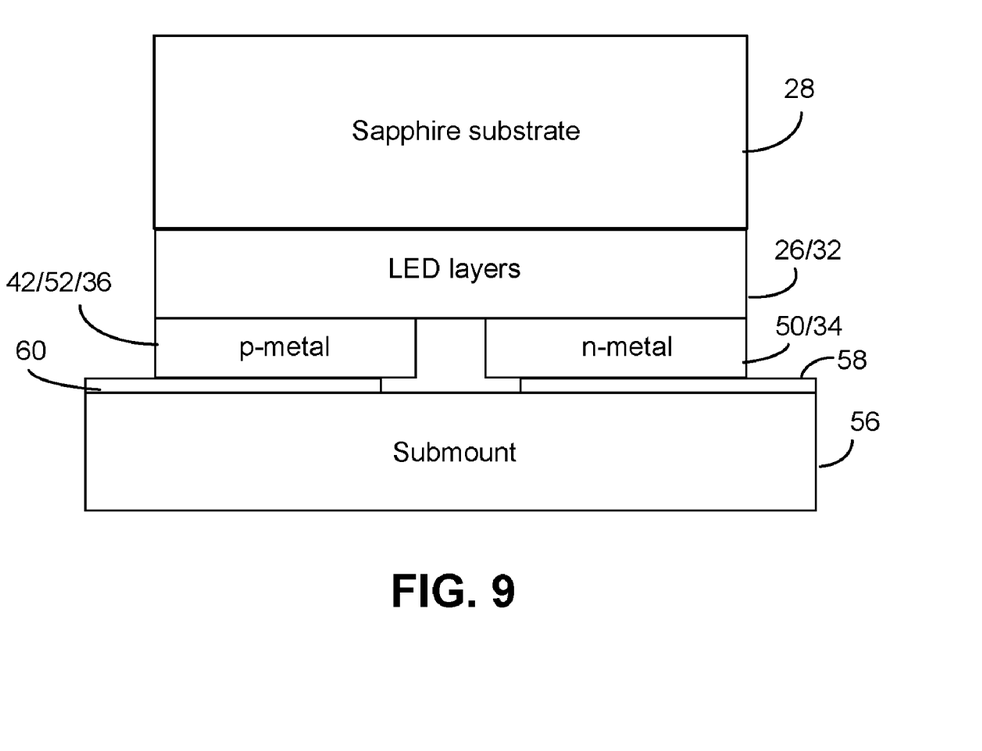
FIG. 9 is a simplified side view showing how the submount electrode edges may be recessed to avoid shorting out the anode and cathode electrodes on the LED layers due to misalignment between the LED layers and submount.

While a pattern on the submount perfectly matching the pattern on the LED provides the best possible mechanical support during die attach assembly, since very small separations between traces of opposite polarity are desired, a small misalignment may result in electrical shorting of the device. One alternative embodiment, as shown in FIG. 9, is to form a submount electrode pattern whose edges are recessed from the shape of the LED electrode pattern to minimize the risk of such misalignment shorting out the LED electrodes, The submount can be a ceramic instead of silicon, and the metal patterns can be directly formed on the ceramic surfaces.

The substrate may also have integrated features such as ion implants to realize Zener diodes for electro-discharge protection.

An ultrasonic transducer applies downward pressure to the LED structure and rapidly vibrates the LED die with respect to the submount 56 so that the Au atoms from the opposing bonding metals merge to create an electrical and mechanical connection between the LED die and the submount. As previously stated, other methods for LED-to-submount interconnection can be used, such as thermosonic metal-to-metal interdiffusion or using a soldering layer.

Figure 10:
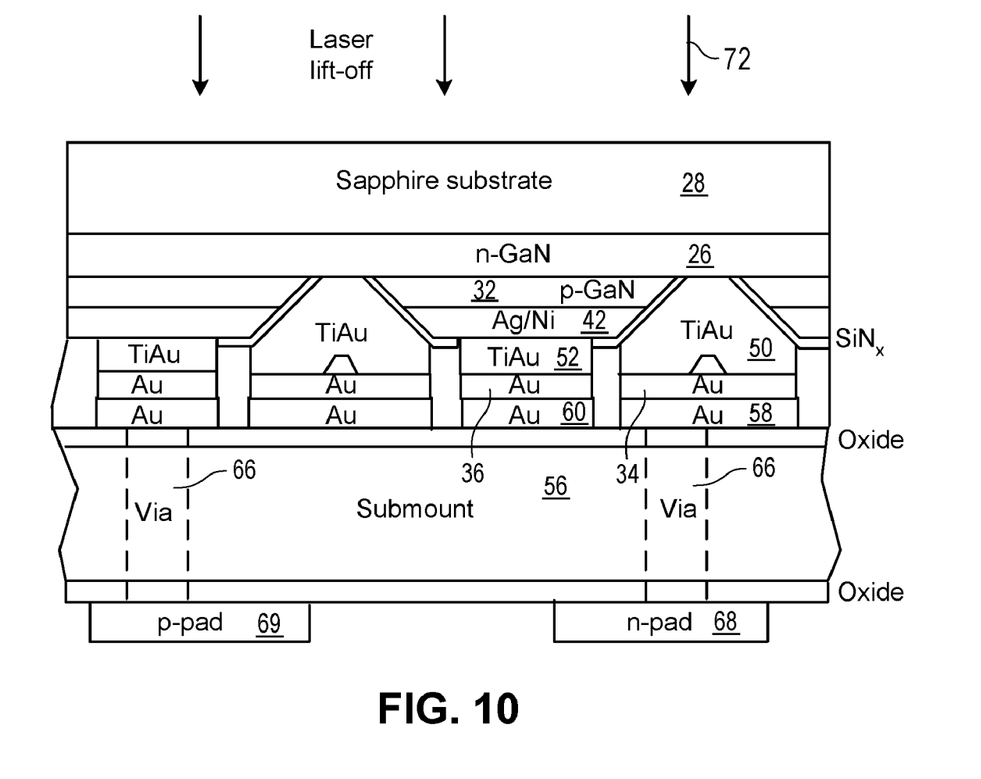
FIG. 10 illustrates the laser lift-off process for removing the sapphire substrate, while creating tremendous downward pressure on the LED structure originating from the semiconductor ablation and hot gas formation.

In FIG. 10, an excimer laser beam 72 is transmitted through the transparent sapphire substrate 28 and evaporates a top layer of the n-GaN layer 26. This creates tremendous pressure at the substrate/n-GaN layer 26 interface. Such pressure would crack the thin LED layers were it not for the large area support from the bonding metal at the LED die/submount interface. Since there are no gold stud bumps and the metal bonding layers 34 and 36 have very minimal gaps and trace separations, there is no need for an underfill to support the LED die.

Figure 11:
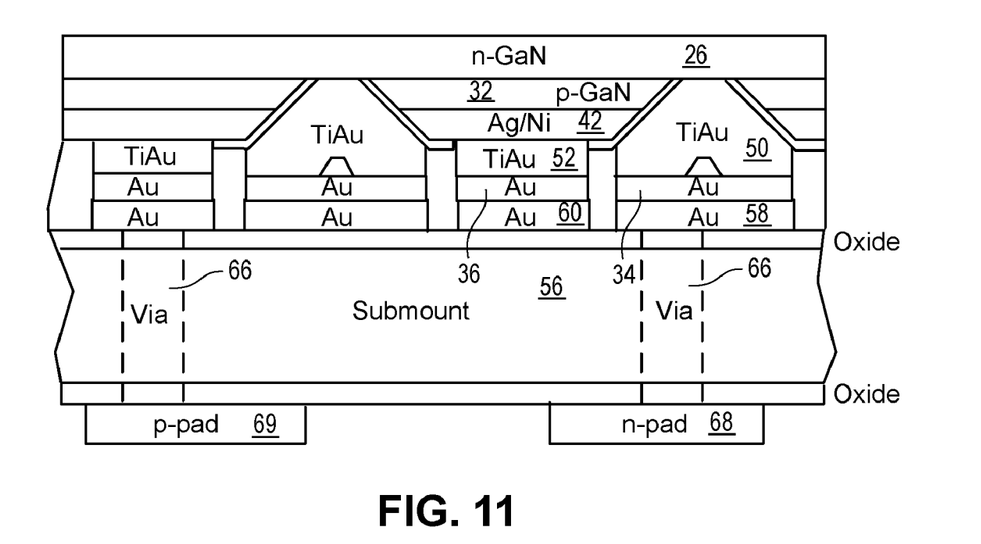
FIG. 11 is a partial cross-section of the LED structure and submount after the substrate has been removed.

The pressure forces the substrate 28 off the n-GaN layer 26, and the substrate is then removed, as shown in FIG. 11.

In one embodiment, LED dies and the growth substrate are still part of a single wafer when bonded to a submount structure. Removal of the sapphire substrate as a single wafer allows the substrate to be reused. After the substrate is removed, the submounts/dies may be scribed and separated using standard techniques.

Figure 12:
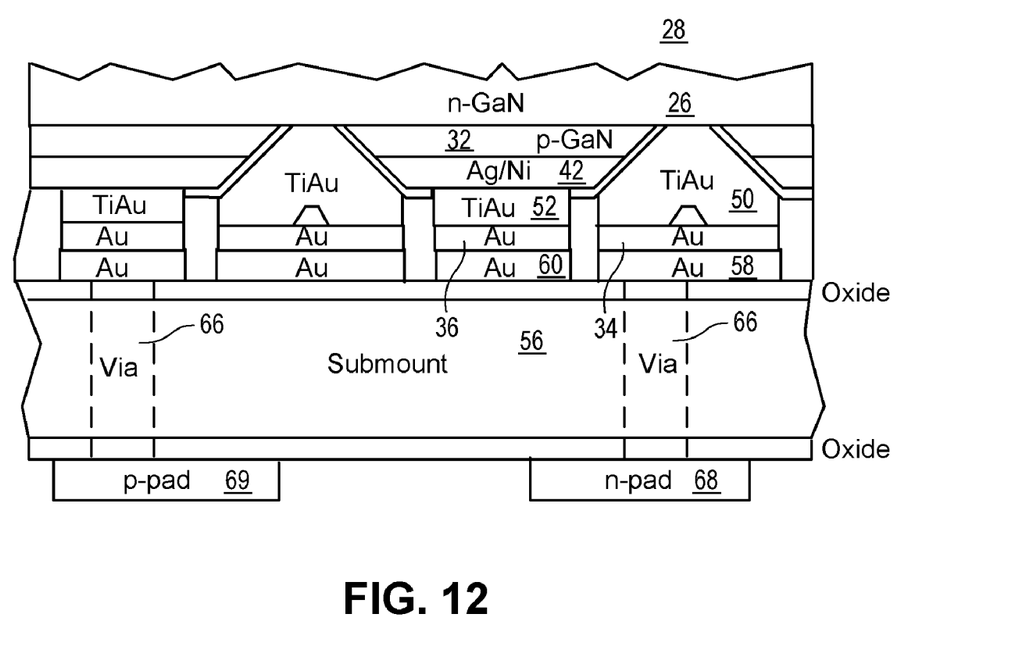
FIG. 12 illustrates the structure of FIG. 11 after the exposed n-layer is roughened to improve the light extraction efficiency.

In FIG. 12, the top surface of the n-GaN layer 26 is roughened by photo-electro-chemical etching, or by small scale imprinting or grinding, to reduce internal reflections and increase the light extraction efficiency of the LED. Roughening also includes forming prisms or other optical elements on the surface for increased light extraction and improved control of the radiation pattern.

The edge of the LED die is particularly fragile if it is cantilevered over the bonding metal or if the submount metal bonding pattern does not completely support the metal bonding pattern along the edge of the LED die. To increase the strength of the edge of the LED die, the metal plating (Au, Cu, or other malleable metallic material as described above) on the back of the LED die can be made thicker (e.g., greater than 20 microns) and extended to the very edge of the device. The device can then be scribed and singulated with dividing lines that are traced directly through the metal. This method also allows to maximize the usable area of the LED device.

In FIG. 3, there is a thin edge region along the lower edge of the LED die where there is little support for the edge provided by the Au plating, and the n GaN layer 26 contact holes are near the edge, further weakening the edge. This thin metal edge contacting the n GaN layer may even be eliminated. The non-symmetrical design is beneficial for extending a p electrical conductor on the submount out from the edge of the LED die, since the p conductor need only span a narrow strip of n-metal between the p bonding metal 36 and the edge of the LED die. However, the p contact areas and p bonding metal 36 portions can be shifted more to the center of the LED die, to create a symmetrical bonding pattern, so that there is equal support of the LED die around all edges. This symmetrical design is shown in FIG. 13.

Figure 13:
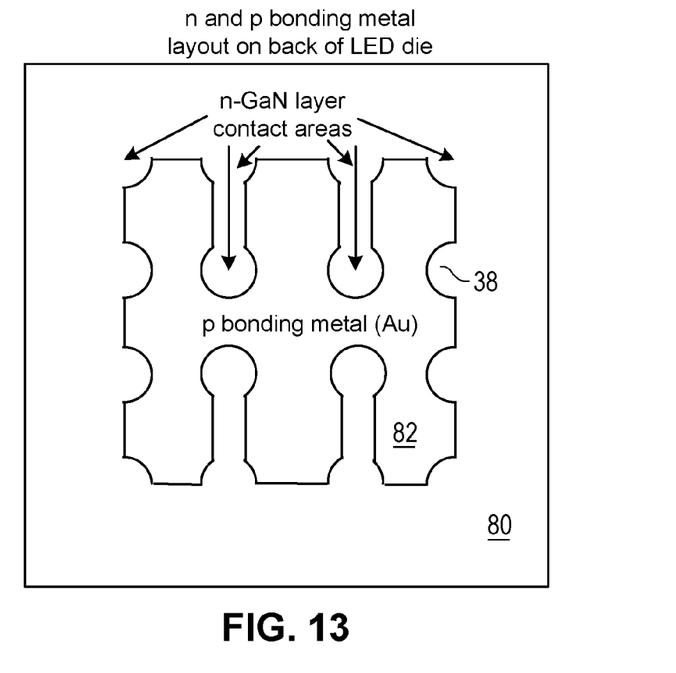
FIG. 13 illustrates another embodiment of a bonding metal pattern on the back of the LED structure.

FIG. 13 shows the metal pattern on the back of an LED die, where n bonding metal 80 is connected to the circular contacts for the n-GaN layer 26 (FIG. 6). The areas of the underlying circular contacts to the n-GaN layer 26 are shown as rounded areas 38 along the edges of the p bonding metal 82. The p bonding metal 82 contacts the underlying metal making direct contact to the p-GaN layer 32 (FIG. 6). There is a small gap (e.g., 27 microns) between the two metal portions.

Figure 14:
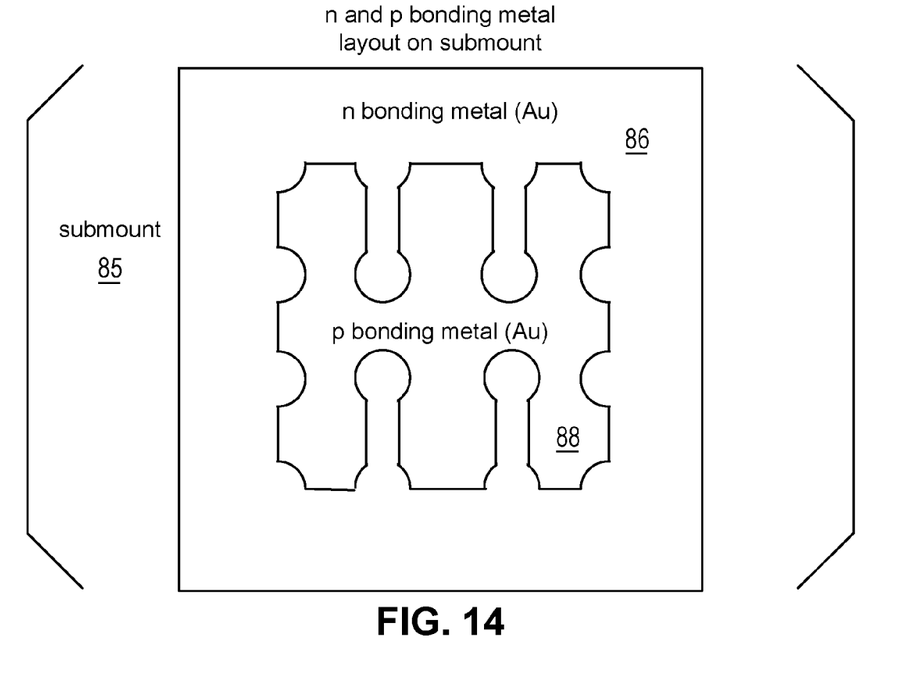
FIG. 14 illustrates a submount bonding metal pattern corresponding to the bonding metal pattern on the LED die shown in FIG. 13.

FIG. 14 illustrates the metal pattern on the surface of the submount 85. Only a portion of the submount is shown. The n bonding metal 86 and the p bonding metal 88 correspond to the patterns on the back of the LED die.

In one embodiment, conductive vias are formed through the submount, as in FIG. 8, that contact the underside of the n and p bonding metal of FIG. 14. In one embodiment, there are two vias contacting the p bonding metal 88 along the center section of the p bonding metal to better distribute the current. The vias are connected to a p metal pad on the bottom surface of the submount, similar to that shown in FIG. 12. Similarly, distributed vias connect the n bonding metal 86 to an n metal pad on the bottom surface of the submount.

Alternately, an insulated metal layer on the top surface of the submount may connect between the p bonding metal 88 and a p metal pad on the top surface of the submount. The n bonding metal 86 would also be connected to an n metal pad on the top surface of the submount. In another embodiment, one pad may be on the top surface of the submount and the other pad may be on the bottom surface.

Figure 15:
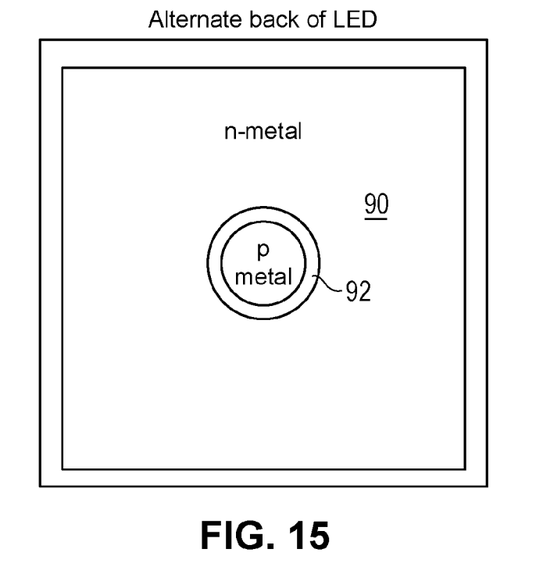
FIG. 15 illustrates another embodiment of a bonding metal pattern on the back of the LED structure.

FIG. 15 illustrates another bonding metal pattern on the back surface of the LED die, showing n bonding metal 90 and p bonding metal 92. The n bonding metal is pulled back from the edge of the LED GaN layers if necessary to improve the separating of the dies during laser scribing and breaking of the wafer. An underlying p metal layer, insulated from the n bonding metal by an insulation layer, may contact the circular p bonding metal 92 and contact various areas of the p-GaN layer 32 to spread current. Multi-level metallization is a well known technique.

Figure 16:
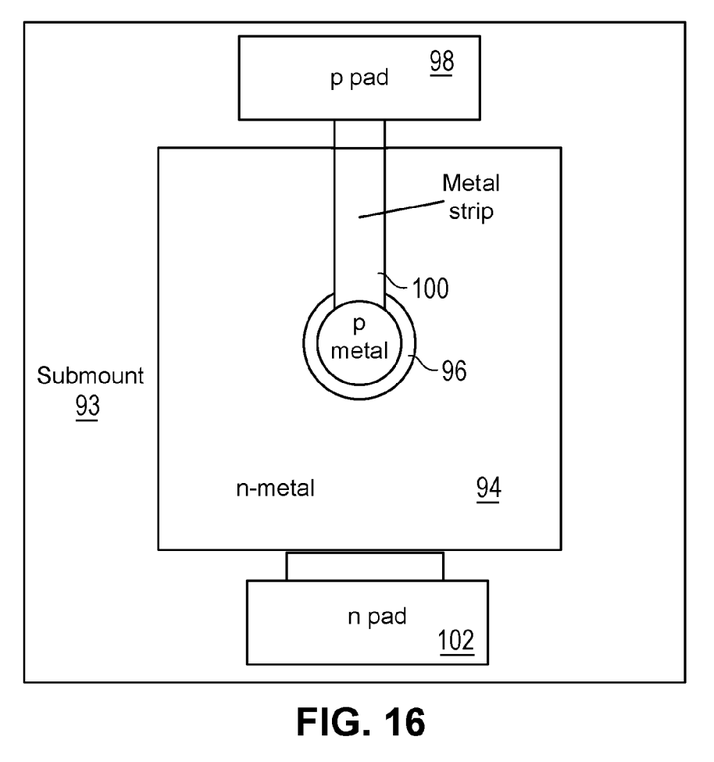
FIG. 16 illustrates a submount bonding metal pattern corresponding to the bonding metal pattern on the LED die shown in FIG. 15.

FIG. 16 illustrates the metallization on the surface of the submount 93. The n bonding metal 94 and the p bonding metal 96 generally correspond to the pattern on the LED die. A p pad 98, such as for a wire bond to a power supply, is connected to the p bonding metal 96 by a metal strip 100, which is below and insulated from the n bonding metal 94. The n bonding metal 94 is connected to an n bonding pad 102.

Figure 17:
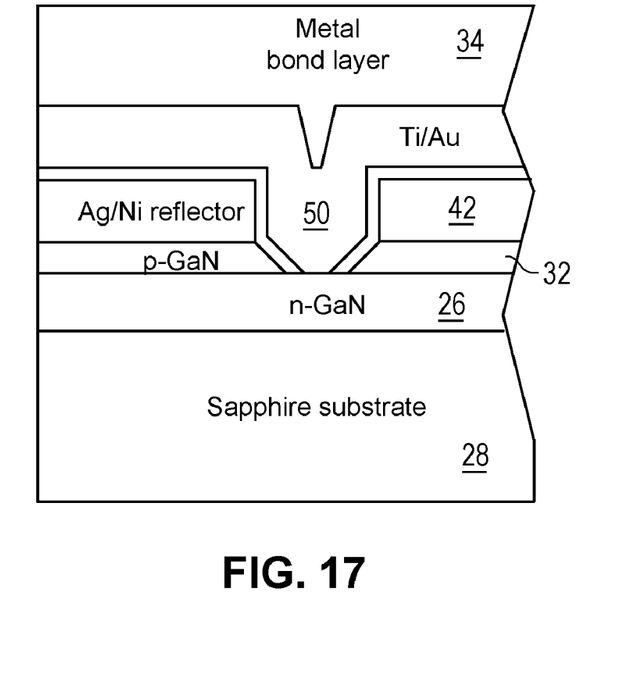
FIG. 17 illustrates an edge portion of the LED structure, where a groove for electrically contacting the n-type layer is formed away back from the edge (in contrast to FIG. 4) so the edge is better supported by the electrode metal and semiconductor material.

In the embodiment of FIG. 4, the edges of the die are weak due to the removal of some of the GaN material. The edges may be strengthened by etching an n-layer contact groove further from the edge so the full GaN layers remain along the edge, as shown in FIG. 17. FIG. 17 just shows the edge portion of the LED structure. Metal is then deposited in the groove to contact the n-type GaN layer. A drawback of this is that it isolates the p GaN layer along the edge, reducing the brightness of the LED.

Figure 18:
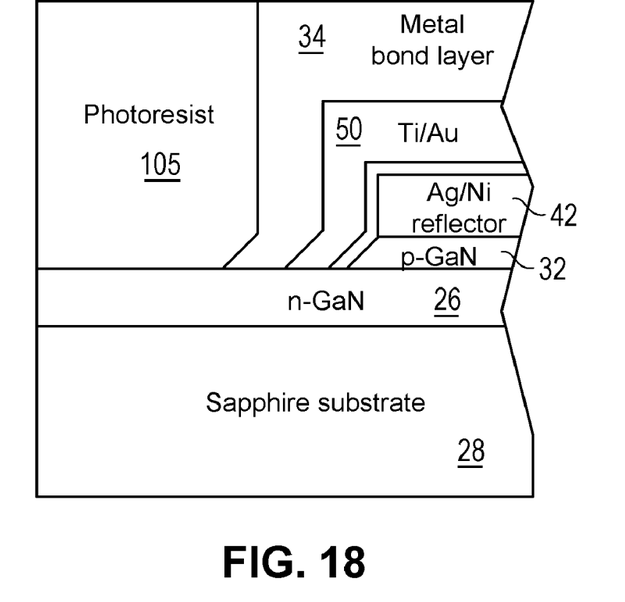
FIG. 18 illustrates an edge portion of the LED structure, where photoresist is used to support the edge of the LED die during the substrate laser lift-off process.

Alternatively, as shown in FIG. 18, a rectangular ring of photoresist 105 may be formed along the etched edge of each die to support the edge during the substrate lift-off process after the LED is mounted to the submount. The photoresist is thick enough to contact the submount or the bonding metal layer on the submount for support. After the substrate is removed, the photoresist is then stripped away.

The metal interconnect system described herein possesses thermally matched and uniform expansion behavior so as to minimize thermally induced stresses on the semiconductor material. Further, the metal interconnect system, having a very large area, provides an optimal heat sinking function for maximum reduction of the operating temperature of the device.

In one embodiment, the bonding metal on the LED is planarized by polishing to ensure a perfectly flat surface for improved support.

Any combination of the features in the various structures may be combined.

Figure 19:
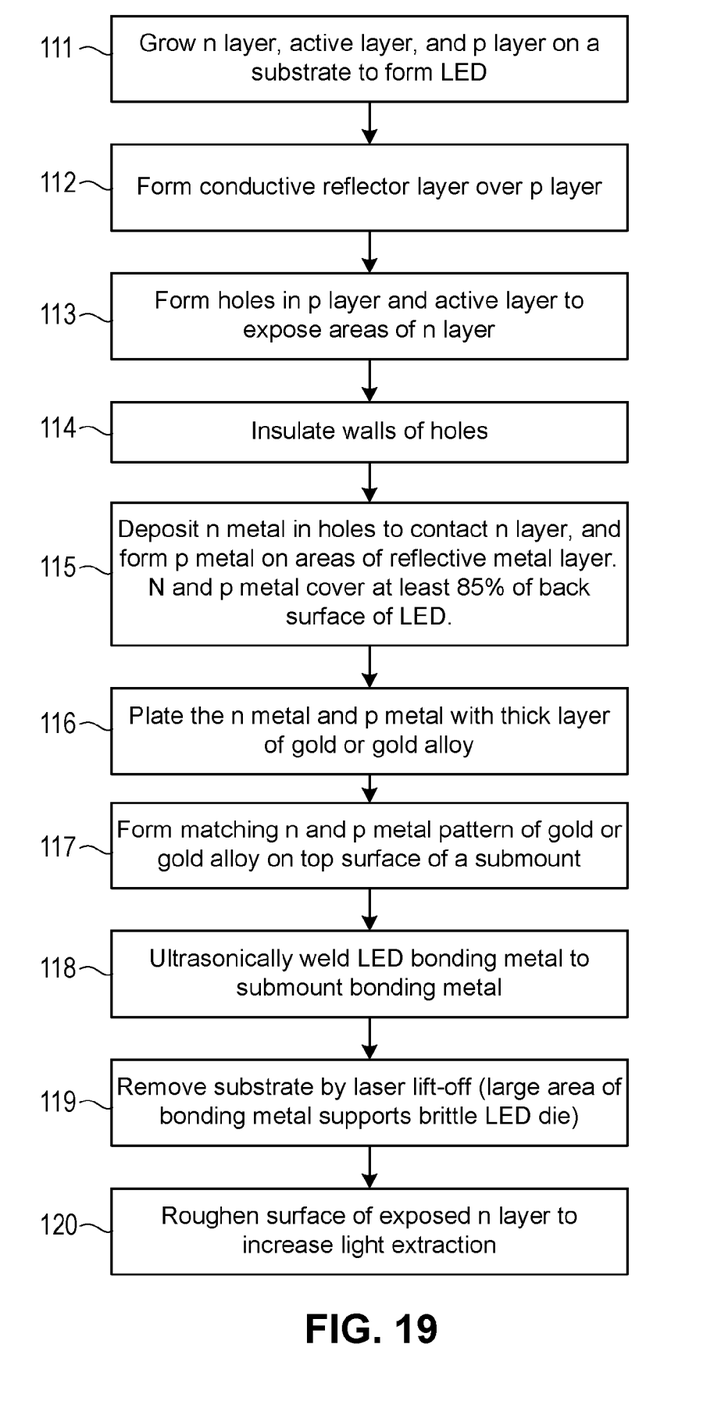
FIG. 19 is a flowchart showing certain steps for forming an LED structure in accordance with one embodiment of the invention.

FIG. 19 is a flowchart identifying certain steps in one embodiment of the above-described process. In step 111, LED layers are grown on a substrate, such a sapphire. In step 112, a reflective metal, as well as barrier metal layers, are formed over the top p layer. In step 113, contact holes are formed through the p layer and active layer to expose portions of the n layer. In step 114, an insulation layer is formed to insulate the walls of the holes and portions of the top surface of the reflective layer. In step 115, a metal (e.g., TiAu) is deposited in the holes and over the reflective layer to separately contact the n layer and p layer. In step 116, the contact metal is plated with Au to form a thick bonding layer.

In step 117, a corresponding bonding metal pattern is formed on a submount. In step 118, the bonding metal on the LED is ultrasonically bonded directly to the bonding metal on the submount so that over 85% of the LED die is supported by the submount. In step 119, the substrate is removed by laser lift-off, creating a high pressure on the LED layers, and the wide area support by the bonding metal prevents fracture of the LED layers. In step 120, the exposed n layer is roughened for increasing light extraction.

A lens may be affixed or molded over the LED die for affecting the light emission and protecting the LED.

Having described the invention in detail, those skilled in the art will appreciate that given the present disclosure, modifications may be made to the invention without departing from the spirit and inventive concepts described herein. Therefore, it is not intended that the scope of the invention be limited to the specific embodiments illustrated and described.

What is claimed is:

1. A method of fabricating a light emitting diode (LED) structure comprising:
   growing an n-type layer, an active layer, and a p-type layer over a growth substrate, forming LED layers;
   forming openings in the p-type layer and active layer to expose areas of the n-type layer;
   forming a first metal portion extending through the openings to electrically contact the n-type layer;
   forming a second metal portion to electrically contact the p-type layer;
   wherein the first metal portion and the second metal portion form a first bonding metal on a back surface of an LED die, the first bonding metal covering at least 85% of the back surface of the LED die;
   forming a second bonding metal on a submount generally corresponding to the first bonding metal on the LED die;
   interconnecting the first bonding metal to the second bonding metal, with substantially no gaps between the first bonding metal and the second bonding metal, so that the back surface of the LED die is supported by the first bonding metal, the second bonding metal, and the submount, wherein at least 85% of the back surface of the LED die is directly supported by the first bonding metal, the second bonding metal, and the submount in a direction perpendicular to the back surface of the LED, whereby the second bonding metal underlies at least 85% of the back surface of the LED; and
   removing the substrate from the LED die, during a laser lift-off process, by exposing the LED die to a laser beam to allow the substrate to be lifted off the LED die without using an underfill between the submount and the LED layers to support the LED layers during the laser lift-off process, wherein the LED layers form a substantially rectangular surface, wherein the first bonding metal extends completely to an edge of the rectangular surface such that a perimeter of the rectangular surface is directly supported by at least portion of the first bonding metal, the second bonding metal, and the submount.

2. The method of claim 1 wherein forming the first metal portion and the second metal portion comprises plating metal areas electrically contacting the n-type layer and the p-type layer to form the first bonding metal on the back surface of the LED die.

3. The method of claim 1 wherein the first metal portion and the second metal portion comprise metal having a thickness exceeding 20 microns to provide support of the LED layers during the laser lift-off process.

4. The method of claim 1 wherein the first metal portion and the second metal portion are separated for electrical insulation by a gap less than 50 microns.

5. The method of claim 1 wherein the LED layers form a substantially rectangular surface, wherein the first bonding metal substantially extends to an edge of the rectangular surface.

6. The method of claim 1 wherein the first bonding metal and the second bonding metal are substantially thermally matched so as to have uniform expansion behavior for limiting thermally induced stresses on the LED layers.

7. The method of claim 1 wherein the step of forming a second bonding metal on a submount generally corresponding to the first bonding metal on the LED die comprises forming the second bonding metal to have gaps between anode and cathode portions that precisely match gaps in a layout of the first bonding metal.

8. The method of claim 1 wherein the step of forming a second bonding metal on a submount generally corresponding to the first bonding metal on the LED die comprises forming the second bonding metal to have gaps between anode and cathode portions larger than gaps in a layout of the first bonding metal.

9. The method of claim 1 wherein the second metal portion comprises a reflective metal for reflecting light towards the n-type layer.

10. The method of claim 1 wherein anode and cathode portions of the first bonding metal portion form interdigitated metal fingers.

11. A method of fabricating a light emitting diode (LED) structure comprising: growing an n-type layer, an active layer, and a p-type layer over a growth substrate, form LED layers:
   forming opening in the p-type layer and active layer, and a p-type layer over a grow substrate, forming LED layers;

forming a first metal portion extending through the openings to electrically contact the n-type layer;

forming a second metal portion to electrically contact the p-type layer;

wherein the first metal portion and the second metal portion form a first bonding metal on a back surface of an LED die, the first bonding metal covering at least 85% of the back surface of the LED die;

forming a second bonding metal on a submount generally corresponding to the first bonding metal on the LED die;

interconnecting the first bonding metal to the second bonding metal with substantially no gaps between the first bonding metal to the second bonding metal, so that the back surface of the LED die is supported by the first bonding metal, and the submount, wherein at least 85% of the back surface of the LED die is directly supported by the first bonding metal, the second bonding metal, and the submount in a direction perpendicular to the back surface of the LED, whereby the second bonding metal underlies at least 85% if the back surface of the LED; and removing the substrate from the LED die, during a laser lift-off process, by exposing the LED die to a laser beam to allow the substrate to be lifted off the LED die without using an underfill between the submount and the LED layers to support the LED layers during the laser lift-off process, wherein the LED layers form a substantially rectangular surface, wherein a perimeter of the rectangular surface is supported by a photoresist layer that contacts the submount during the laser lift-off process.

* * * * *